United States Patent [19]

Mack

[11] Patent Number: 5,175,024
[45] Date of Patent: Dec. 29, 1992

[54] PROCESSES FOR PREPARATION OF OXIDATION RESISTANT METAL POWDERS

[75] Inventor: Arthur G. Mack, Naperville, Ill.

[73] Assignee: Akzo N.V., Arnhem, Netherlands

[21] Appl. No.: 790,602

[22] Filed: Nov. 8, 1991

Related U.S. Application Data

[63] Continuation-in-part of Ser. No. 416,570, Oct. 3, 1989, Pat. No. 5,064,469.

[51] Int. Cl.$^5$ .............................................. C09K 15/18
[52] U.S. Cl. ................................ 427/216; 106/14.42; 252/512; 252/513; 252/514; 427/217
[58] Field of Search ............... 106/14.13, 14.15, 14.16, 106/14.42; 252/512, 513, 514; 427/216, 217

[56] References Cited

U.S. PATENT DOCUMENTS

| | | | |
|---|---|---|---|
| 4,382,981 | 5/1983 | Stoetzer et al. | 427/105 |
| 4,387,115 | 6/1983 | Kitamura et al. | 427/58 |
| 4,539,041 | 9/1985 | Figlarz et al. | 75/0.5 A |
| 4,614,837 | 9/1986 | Kane et al. | 174/68.5 |

FOREIGN PATENT DOCUMENTS

| | | |
|---|---|---|
| 0297677 | 1/1989 | European Pat. Off. |
| 2157670 | 10/1985 | United Kingdom ............ 106/14.42 |
| 2171410 | 8/1986 | United Kingdom. |

*Primary Examiner*—Karl Group
*Assistant Examiner*—Anthony J. Green
*Attorney, Agent, or Firm*—James K. Poole; Louis A. Morris

[57] ABSTRACT

Metallic objects such as conductive metal powders comprising metal such as copper, nickel, silver, cobalt and palladium can be treated to remove surface oxide layers by contacting with a combination of a chelating amine compound and a reducing catechol derivative at elevated temperature, preferably in a solution of ethylene glycol.

17 Claims, No Drawings

PROCESSES FOR PREPARATION OF OXIDATION RESISTANT METAL POWDERS

REFERENCE TO RELATED APPLICATION

This application is a continuation-in-part of my copending, co-assigned application Ser. No. 07/416,570, filed Oct. 3, 1989 and now U.S. Pat. No. 5,064,469.

FIELD OF THE INVENTION

The present invention relates to the treatment of the surfaces of metal objects, including the production of conductive metal powders, showing an improved resistance to oxidation and loss of electrical conductivity. Such powders find applications in the electronics industry; for example, in metallizations of dielectric surfaces or as fillers for filled thermoset polymers, for conductive adhesives for surface mounted devices, for EMI paints, for polymer thick film pastes for circuits, and for conductive elastomers for EMI gaskets.

The invention further relates to a composition-of-matter useful for rendering copper and nickel surfaces electrically conductive and oxidation resistant.

BACKGROUND OF THE INVENTION

Metal powders find extensive use in the production of electrically conductive articles. Whereas a noble metal such as gold is sufficiently noble to resist oxidation, and silver forms oxides retaining some conductivity, less expensive metals such as copper and nickel will be readily oxidized upon exposure to air. In copper or nickel powder of the desired particle size, non-conductive copper or nickel oxide surface layers are quickly formed to the extent that the powders, as commercially available, do not show any significant bulk conductivity.

This problem has been recognized in the art, and it has been proposed to reduce the oxide surface layers just prior to or during the deposition of the metal powder onto a dielectric substrate (U.S. Pat. No. 4,614,837 and EP-A-297,677). These known methods suffer from the inconvenience that immediate further processing is required after the reduction, because the conductive surfaces formed lack a significant resistance to rapid re-oxidation.

Other known methods being more particularly directed to the incorporation of copper or nickel powder into resinous compositions propose the protection of conductive powders by the use of certain antioxidants and/or coupling agents, deposited onto the metal powder or included in the resin composition.

GB-A-2,171,410 discloses polymer compositions containing a metal powder having deposited thereon a combination of an amino compound, such as N-stearyl propylene diamine, and a silane coupling agent, such as 3-aminopropyl trimethoxy silane.

As shown by the comparative experiments hereinbelow, these coated powders as such show a limited storability.

According to U.S. Pat. No. 4,387,115, oxidation stabilized compositions can be obtained by curing a mixture of a metallic copper powder having a copper oxide surface film, a reducing agent containing a substituted or unsubstituted ortho or para dihydroxy benzene ring and a curable resin. The mixture may optionally comprise a chelate forming compound, inter alia aliphatic diamines. It is emphasized in this publication that the reduction of the copper oxide should occur during curing of the resin in order to ensure the ability of the resulting cured product to retain conductivity. Therefore, this publication does not provide any suggestion that the chemical compounds mentioned therein in general terms would show any merits in rendering free copper or nickel powder conductive, let alone resistant to re-oxidation. A comparative experiment hereinbelow shows that the combination of reducing agent and chelating agent effective in Run No. 5 of U.S. Pat. No. 4,387,115 for rendering copper powder conductive when enclosed in a cured resin matrix failed to produce an electrically conductive copper powder in the present process.

U.S. Pat. No. 4,382,981 discloses conductive coating compositions containing copper powder and an organic titanate coupling agent. Whereas the use of such organic titanate coupling agents is an option of a preferred embodiment of the present process, it is shown by the comparative experiments below that the sole use of such coupling agents is not effective in the present process.

U.S. Pat. No. 4,539,041 discloses a method for forming metal powders by reducing the hydroxide or salt of, inter alia, copper or nickel by heating said compound suspended in a polyol. The sizes and shapes of particles, as well their homogeneity, can be controlled in some cases. However, the present process offers a much wider choice of morphology for the conductive powder, since no restrictions on the morphology of the starting metal powder need apply. Using different starting materials, the present processes are clearly distinct from this known method. Whereas it was found that conductive copper powder can be produced from commercial non-conductive powder by heating in ethylene glycol, the powder thus obtained showed unsatisfactory resistance to oxidation. U.S. Pat. No. 4,539,041 provides no hint to the use of the present reagents and processes, which surprisingly produce surfaces of enhanced oxidation stability.

Some commercial copper and nickel powders are available for electronic applications, which are believed to comprise a proprietary protective coating. However, these powders, when tested, showed either no conductivity at the time supplied or rapidly lost conductivity under more severe storage conditions.

SUMMARY OF THE INVENTION

It is an object of the present invention to provide a process for producing conductive copper or nickel surfaces showing enhanced oxidation stability. Furthermore, it is an object to provide conductive metal powders, particularly copper or nickel powders, having improved oxidation stability to the extent that they may be produced centrally and supplied to various users for direct applications in metallizations, conductive pastes, conductive plastics, etc. for producing electronic articles having longer lifetimes.

It is also an object of the invention to provide a composition useful for rendering metal surfaces conductive and oxidation resistant.

These and other objects are attained by a process wherein the surface layer of commodity copper or nickel objects is treated with a combination of a chelating amine compound and a reducing catechol derivative at elevated temperature until substantially all metal compounds present are reduced, and an electrically conductive and re-oxidation resistant surface is obtained. The reduction phase of the process can be expedited and improved by the use of ultrasound equipment.

DETAILED DESCRIPTION OF THE INVENTION

According to the process of the invention, the surfaces of metal objects comprising metals selected from the group of copper, nickel, cobalt, silver and palladium as the major metallic constituent are heated in the presence of (i) an amine compound having at least one group carrying a coordinative functional substituent, the amine nitrogen atom and the functional substituent being separated by from two to six other atoms; and (ii) at least one phenolic compound selected from the group of 1,2-dihydroxy benzene and its ring-substituted derivatives, and the resulting conductive surface is substantially separated from the reagents and reaction products.

As discussed in detail below, single reagents combining the features of (i) and (ii) ca be employed.

Suitable objects for these treatments may have any shape, such as foils, sheets, rods and particles. Also, surface layers or metallizations adhered to non-metallic substrates will fall within the present definition, so long as at least a part of the surface of the assembly contains the metal and is susceptible to the treatment according to the invention. Suitable objects or their relevant surface layers to be subjected to the present process comprise as major constituents one or more of the metals indicated above, preferably copper or nickel, and may comprise as further constituents other alloying metals or metal oxides, metal hydroxides or further metal compounds, usually copper or nickel oxides in the form of surface layers resulting from oxidation reactions during storage at the surface of the freshly produced metallic objects. The present process is especially envisaged for treating commercially available commodity copper or nickel powders which normally are nonconductive due to such surface oxide layers.

The shape of the particles in principle is immaterial to the present process, and may be spherical, flaky, oblong, fibrous, irregular, or constitute agglomerates of any of the aforementioned shapes. Powders comprising spherical or flaky particles, or their agglomerates, are of the greatest practical interest. Starting particles to be treated by the present process do not require removal of the metal oxides prior to further treatment according to the invention.

The first reagent (i) in the treatment according to the invention is an amine compound, being defined herein as an organic compound derivable from ammonia by replacement of one or more hydrogens by organic groups, and should have at least one group carrying a functional substituent having coordinative capacity towards metal atoms such as copper or nickel atoms. Suitable functional substituents include hydroxy, amino, carboxy and mercapto. For enabling metal chelate formation in cooperation with the amine nitrogen atom, the functional substituent should be removed from the latter over a distance of from two to six other atoms, usually carbon atoms, along the interconnecting chain. Rigid structures, such as para-substituted aromatics, will prevent chelate formation and diminish the coordinative ability of the functional substituent. Preferably the group carrying the functional substituent is an aliphatic group. Amine compounds having hydroxyalkyl groups are readily available and can be prepared, inter alia, by alkoxylation of any primary or secondary amine. Also readily available are amine compounds having an aminoalkyl group, such as ethylenediamine and propylenediamine and their N-substituted derivatives. Other amine compounds having chelating capacity are mentioned in EP-A-297,677 and are incorporated herein by way of reference. Preferred amine compounds are bis-(2-hydroxyalkyl)$C_{8-20}$ alkyl amines and amides, such as bis-(2-hydroxyethyl) lauryl amine and N,N-bis-(2-hydroxyethyl) lauramide, tetramethyl ethylenediamine, tetramethyl propylenediamine and diethanolamine.

The second reagent (ii) in the treatment according to the invention is at least one substituted or unsubstituted 1,2-dihydroxy benzene (or catechol). Besides catechol itself, any of its derivatives being substituted at one to four of its remaining ring positions can be used. Suitable substituents include alkyl or alkenyl groups, which may be further substituted, and may be straight or branched, and acid groups, such as carboxylic and sulphonic; aldehyde groups, ether groups, ester groups, amino groups and amido groups. In some cases, combinations of two or more of these phenolic compounds have appeared to be particularly beneficial. Preferred reagents (ii) include 1,2-dihydroxy benzene, 3,5-di-t-butyl 1,2-dihydroxy benzene, 3,4-dihydroxy benzaldehyde and 3,4-dihydroxy benzoic acid.

Single reagents combining the features (i) and (ii) above, being both an amine compound and a phenolic compound as defined above, may also be used in the present process. Thus, a 1,2-dihydroxy benzene substituted by a further group which is an amine carrying a functional substituent will perform both the chelating and reducing activity and can be used as a single reagent in the present process. Exemplary for such singular reagents (i) and (ii) are N-(N'-2-aminoethyl 2-aminoethyl) 1,2-dihydroxy benzamine and diethanol aminoethyl 3,4-dihydroxy benzoic ester.

The treatment according to the invention is carried out at elevated temperatures, so that reduction reactions take place. The amounts of reagents should be sufficient for complete reduction of the metal oxides present, but normally excess amounts of reagents will be used, the excess materials being separated together with the reaction products after the heating. Generally, the heating temperatures vary between about 100° and about 300° C. The treatment may be carried out using neat reagents (i) and (ii), being liquid at the heating temperature. However, the separation step will require extensive washing then. Therefore, it is desirable to use a liquid carrier having lower viscosity at ambient temperatures and high solubility or miscibility in conventional washing liquids such as isopropanol. Monomeric diols or polyols containing at least two adjacent hydroxyl groups can also be used.

A preferred liquid carrier is ethylene glycol, which not only allows for easy separation and washing of the conductive copper or nickel particles but will also function as an auxiliary reducing agent. Thus, smaller quantities of reagent(s) (i) and (ii) are required. Thus, ethylene glycol solutions having low concentrations in the order of 1 weight percent of the reagents (i) and (ii) can be used in the present process.

The reduction process can be improved and expedited by the use of suitable ultrasound equipment as illustrated in Examples 17 to 19. However, such treatment should not be continued beyond the point where full reduction of the surface oxides is obtained, as the surface's resistance to oxidation may be reduced.

Upon completion of the heating, in the present process the resulting conductive copper or nickel surface is separated by any known means. When constituting a powder, the particles will conventionally be filtered, washed with a suitable liquid such as an alcohol, and dried. If desired, the dried powder may be sieved to remove large particles and/or agglomerates.

In one aspect of the invention, a composition useful for treating the surfaces of metal objects comprising metals selected from the group consisting of copper, nickel, cobalt, silver and palladium as the major metallic constituent is provided, which composition consists essentially of an ethylene glycol solution of (i) from 0.1 to 20 weight percent of an amine compound having at least one group carrying a coordinative functional substituent, the amine nitrogen atom and the functional substituent being separated by from two to six other atoms, and (ii) from 0.1 to 20 weight percent of at least one phenolic compound selected from the group of 1,2-dihydroxy benzene and its ring-substituted derivatives.

Preferably, such a composition consists essentially of an ethylene glycol solution of
(i) from 0.1 to 10 weight percent of said amine compound;
(ii) (a) from 0.1 to 10 weight percent of 1,2-dihydroxy benzene; and
(ii) (b) from 0.1 to 10 weight percent of 3,5-di-t-butyl 1,2-dihydroxy benzene.

These compositions constitute novel compositions particularly suited for treating the starting metal particles in accordance with the invention, and therefore, constitute an independent embodiment of the same invention. The contemplated uses of the compositions according to the invention include their use for rendering metal surfaces or partial surfaces of formed metal articles conductive and oxidation resistant. Thus, a tarnished sheet of copper is immersed in a composition of the invention, heated, removed from the bath, washed and dried according to the present process to produce a bright and shiny surface which is both conductive and resistant to further oxidation.

EXAMPLES

The invention will be further illustrated by the non-limiting examples which follow. Herein, commercially available copper, silver and nickel powders containing particles coated with a surface layer of the corresponding metal oxides were treated according to the invention to produce electrically conductive and oxidation resistant copper silver and nickel powders.

To allow for a reasonably rapid assessment of the oxidation stability, each sample was subjected to accelerated aging under the following conditions (71° C. AGING). The dried powder sample was sieved to remove particles larger than 325 mesh (0.044 mm). The sieved material (10 g) was made into a slurry in 1,2-dichloroethane (15 g) and drawn down onto a sheet of polyetherimide resin (Ultem ®, ex. General Electric) using a 50 micron draw down bar and allowed to dry. The surface resistivity of the powder coating was measured by a 4 probe method using a Keithly 195A digital ohmmeter using its 4 terminal resistance input (modified ASSM F 390) before placing the sample in an oven at 71° C., and the surface resistivity was remeasured at the time intervals mentioned.

In this test, by spreading out the powder, maximum exposure to air is ensured and, by heating, the air oxidation is accelerated. Under practical storage conditions, such as in closed containers at ambient temperature, longer storage with retention of low resistivity values is observed and Example 12 provides some data for comparing both storage conditions.

EXAMPLE 1

Copper flake (USB CU5000, ex. United States Bronze) 70 lbs. (32 kg) Was suspended in ethylene glycol 385 lbs. (175 Kg) containing 0.7 lbs. (320 g) each of bis-(2-hydroxyethyl)tallowamine (Armostat ® 310, ex. Akzo), 1,2-dihydroxy-benzene, and 3,5-di-t-butyl 1,2-dihydroxybenzene. The mixture was stirred and brought to reflux (at about 195° C.) and kept at this temperature for 1 hour before cooling and filtering in a Rosenmond filter. The filter cake was washed three times, each with 110 lbs. (50 kg) of isopropanol, before drying on the filter by use of a nitrogen purge and vacuum.

The obtained conductive copper flake showed an initial surface resistivity, measured as indicated above, of 0.35 Ohm/square. After storage for 1008 hours in a closed container, a next sample showed a surface resistivity of 0.6 Ohm/square. The results of the aging test are included in Table 1.

EXAMPLE 2

Copper flake (Poudmet 22BB400TV, ex. Poudmet 100 g was heated in ethylene glycol 250 g with 2 g each of tetramethyl ethylenediamine and 3,4-dihydroxybenzaldehyde at 195° C. for 0.5 hour. After cooling, the flake was separated by filtration and washed three times with 250 ml of isopropanol, dried in a vacuum oven at 80° C. and sieved through a 325 mesh sieve to remove oversized particles. The aging test results are included in Table 1.

EXAMPLE 3

Example 2 was repeated, with the difference that the ethylene glycol solution contained 2 g each of N-oleyl-1,3-diaminopropane (Duomeen ® OL, ex. Akzo) and 3,4-dihydroxy benzoic acid. The aging results are included in Table I.

EXAMPLE 4

Example 2 was repeated, however using an ethylene glycol solution containing 2 g each of tetramethylethylenediamine and 3,4-dihydroxy benzoic acid. The aging results are in Table I.

EXAMPLE 5

Example 2 was repeated, however, using an ethylene glycol solution containing 1 g each of diethanolamine and 3,5-di-t-butyl 1,2-dihydroxy benzene. The aging results are included in Table I.

EXAMPLE 6 (Control)

For dissolution and removal of the copper oxide surface layer copper flake (Poudmet 22BB400TV) 100 g was added to a stirred solution of citric acid 40 g in 800 ml of a 1:1 water:methanol mixture and stirred for ½ hour. The flake was then filtered and washed with water (4×500 ml) and acetone (4×250 ml) and dried, all under a nitrogen atmosphere. The resulting powder was immediately tested in the aging test and represents the aging behavior of unprotected copper powder under the specific test conditions. The results are included in Table I.

EXAMPLE 7 (Control)

Copper flake (Poudmet 22BB400TV) 100 g was suspended in ethylene glycol, 250 g, containing 1 g of diethylenetriamine. The mixture was stirred and heated to reflux at about 195° C. for 0.5 hour before cooling, filtering and washing with isopropanol (3×250 ml). Test results are included in Table I.

EXAMPLE 8 (Control)

Example 7 was repeated, using an ethylene glycol solution of 1 g of 3,5-di-t-butyl 1,2-hydroxybenzene. Test results are included in Table I.

EXAMPLE 9 (Control)

Example 7 was repeated, using ethylene glycol without any addition of reagents. Examples 7 to 9 represent treatments using single reagents, but not the combination according to the invention. The results in Table I show that in the Control Examples substantial reduction of the copper oxide present at the surface of the particles of the commercial powder is achieved and acceptable initial resistivity values are obtained. However, a substantial oxidation resistance is only obtained in the Examples 1-5 using the combinations of reagents according to the invention.

TABLE I

| Time (hours) | Surface Resistivity in 71° C. AGING (Ohm/square) | | | | | | | | |
|---|---|---|---|---|---|---|---|---|---|
| | Ex. 1 | Ex. 2 | Ex. 3 | Ex. 4 | Ex. 5 | Ex. 6 (cont) | Ex. 7 (cont) | Ex. 8 (cont) | Ex. 9 (cont) |
| 0 | 0.35 | 0.8 | 0.5 | 0.87 | 0.8 | 0.5 | 1.8 | 3.6 | 3 |
| 24 | 0.5 | 1 | 1.9 | 3.4 | 1.0 | 2.6 | 5.0 | 8 | 18 |
| 48 | — | — | — | — | 3.0 | 12 | 6.3 | — | 49 |
| 72 | 0.6 | — | — | — | — | — | — | 6000 | 52 |
| 96 | — | 2.4 | 3.7 | 4.0 | 3.5 | 31 | 50 | D | 75 |
| 144-168 | — | 1.8 | 9.5 | 6.5 | 6.0 | 660 | — | — | — |
| 216-288 | 0.95 | 3.0 | 22 | 26 | 9.0 | 1 M | — | — | — |
| 336-360 | 1.5 | — | — | — | — | D | 150 | — | 325 |
| 408-504 | — | 7.9 | 150 | 68 | 49 | | 600 | — | 500 |
| 600-720 | 2.9 | — | — | — | 310 | | 2400 | — | 11K |
| 816-960 | 3.4 | 22 | 1 M | 198 | 400K | | D | — | D |
| 1104-1224 | — | 200 | D | 460 | D | | | | |

(1) Where time ranges are indicated, the resistivity value mentioned was observed at a single point within the indicated time range.
(2) Legends:
M: · 1,000,000
K: · 1,000
D: Discontinued

EXAMPLE 10

Nickel flake (Alcan 756, ex. Aldrich) 200 g was suspended in ethylene glycol (500 g) containing 2 g each of bis-(hydroxy ethyl) tallowamine (Armostat 310, ex. Akzo), 1,2-dihydroxy-benzene, and 3,5-di-t-butyl 1,2-dihydroxy benzene. The mixture was stirred and brought to reflux at about 195° C. and kept there for 1 hour before cooling and filtering (no exclusion of air). The filter cake was washed twice with one liter of isopropanol before drying in a vacuum oven at 75° C. overnight. Results of the aging test are included in Table II. For control the untreated starting powder was also tested.

EXAMPLE 11

Example 10 was repeated, however, using another commercial nickel powder, 3 μm lab. grade ex. Aldrich. The aging test results are included in Table II.

TABLE II

| Treatment Time (Hours) | Surface Resistivity In 71° C. AGING (Ohm/square) | | | | Alcan 752 |
|---|---|---|---|---|---|
| | Ex. 10 | | Ex. 11 | | |
| | yes | no | yes | no | no |
| 0 | 0.5 | 1K | 0.1 | 3.3 | 1 |
| 24 | 0.65 | 1K | 0.1 | 3.3 | 11 |
| 1368 | 1.2 | 1.1 M | 0.1 | 5.6 | 105 |
| 2280 | 2.7 | 1 M | 0.15 | 7 | 153 |

(1) Alcan 752 nickel flake is sold as a conductive grade.
(2) K: · 1,000
M: · 1,000,000

EXAMPLE 12

Copper flake (Poudmet (22BB400TV) was treated as described in Example 1. The treated flake was placed in a container which was closed without any specific measures to exclude air. At the time intervals indicated, samples were taken from the container, drawn down onto polyetherimide film and measured for surface conductivity as described for the 71° C. AGING test:

| Time in Storage (hours) | Surface Resistivity (Ohm/square) |
|---|---|
| 0 | 1.1 |
| 144 | 1.0 |
| 864 | 2.3 |
| 2,160 | 2.5 |

The sample taken and drawn down after 864 hours of storage was aged at 71° C.:

| Time (hours) | Surface Resistivity in 71° C. Aging (Ohm/square) |
|---|---|
| 0 | 2.3 |
| 24 | 11 |
| 336 | 47 |
| 504 | 6,700 |

While the storage in a closed container is believed to be representative for the practical circumstances of manufacture and use of conductive copper powder, the 71° C. AGING test provides a more rapid method for screening and comparing several treatments. The above reference data indicate that passing the 71° C. AGING test for 100 hours corresponds to normal storage times with retained conductivity for months.

EXAMPLE 13

A bath of ethylene glycol containing 1 wt. % each of 1,2-dihydroxy benzene, 3,5-di-t-butyl 1,2-dihydroxybenzene and bis-(2-hydroxyethyl)tallowamine (Armostat 310) was heated to 170° C. Thereafter a tarnished sheet of copper was immersed in the hot bath for 30 seconds. After removing the sheet from the bath it was washed with isopropanol and dried. After 1 month exposure to ambient conditions, the bright and shiny surface could still be easily soldered, indicating that the surface is well protected from re-oxidation.

COMPARATIVE EXAMPLE 14

Freshly prepared oxide-free copper flake, 100 g, prepared according to Example 6, was suspended in ethylene glycol, 250 g, containing 1 g each of bis-(2-hydroxyethyl)tallowamine (Armostat 310, ex. Akzo), 1,2-dihydroxybenzene, and 3,5-di-t-butyl 1,2-dihydroxy-benzene. The mixture was stirred and heated to reflux at about 195° C. for 0.5 hour before cooling, filtering and washing two times with 250 ml of isopropanol, and drying at 800° in a vacuum oven. Testing the 71° C. AGING test showed that only a moderate oxidation resistance was achieved:

| Time at 71° C. (Hours) | Surface Resistivity (Ohm/square) |
| --- | --- |
| 0 | 1 |
| 24 | 2.0 |
| 48 | 3.6 |
| 72 | 6.0 |
| 96 | 12 |
| 168 | 16 |
| 216 | 5300 |

This experiment shows that treatment of the oxide surface layer is an important feature of the present invention, as follows from a comparison with Example 1, wherein a commercial copper flake having an oxide coating was subjected to the same treatment. Apparently, the conductive copper powder obtained by the process of the invention is distinguished from copper powders simply having deposited antioxidants on their surface.

COMPARATIVE EXAMPLE 15

Copper flake (Poudmet 22BB400TV) was heated to 195° C. for 0.5 hour in diethylene glycol monomethyl ether, 250 g containing 1 g each of 2-methyl hydroquinone, hexamethylenetriamine and 1,2-dihydroxybenzene. The flake was then separated by filtration and washed three times with 250 ml of isopropanol, dried in a vacuum oven at 800C., and tested for oxidation resistance by the 71° C. AGING test. Since at 0 hours time the surface resistivity amounted to 600,000 Ohm/square, the test was discontinued. This experiment shows that the chemicals used in Example I, Run 5 of U.S. Pat. No. 4,387,115 cannot be successfully used in the present process.

COMPARATIVE EXAMPLE 16

Example 15 was repeated, using an ethylene glycol solution of 3-aminopropyl trimethoxysilane and stearyl propylene-diamine. Upon an initial reading of 600 Ohm/square in the 71° C. AGING test, again the test was discontinued. This experiment shows that the reagent used in Example 5 of GB-A-2,171,410 cannot be successfully used in the present process.

COMPARATIVE EXAMPLE 17

Copper flake (Poudmet) 100 g was treated with ethylene glycol, 250 g, but containing 0.5 g of neoalkyoxy tri(dioctyl)pyrophosphato titanate (LICA 38, ex. Kenrich Petrochemicals) coupling agent, as described in Example 15. The initial reading in the 71° C. AGING test was 4,000 Ohm/square, showing that titanate coupling agents as such are not effective in the present process.

In view of the known use of titanate coupling agent on oxide-free copper surfaces, its compatibility with the reagents used in the present invention was tested. This Example was repeated adding further 1 g each of diethanolamine and 3,5-di-t-butyl 1,2-dihydroxybenzene to the ethylene glycol solution of the organotitanate. In the 71° C. AGING test the results below were obtained:

| Time at 71° (hours) | Surface Resistivity (Ohm/square) |
| --- | --- |
| 0 | 0.27 |
| 20 | 0.6 |
| 96 | 0.7 |
| 168 | 1.4 |
| 288 | 2.0 |
| 336 | 5.0 |
| 624 | 12.0 |
| 888 | 500K |

This experiment shows that, if desired, a coupling agent can be applied to the copper surface by including it in the treatment of the invention, without impairing the oxidation resistance. In fact, some improvement over Example 5 was observed.

The following examples illustrate the effectiveness of the composition and process of the invention in improving the conductivity and resistance to oxidation of silver powders, which typically have surface layers of silver oxides present. In contrast to many other metals, the oxides of silver are conductive, although less conductive than silver itself. Significant improvements in electrical conductivity were achieved by the treatments of the invention, and it is expected that the surfaces of such silver powders or particles would also exhibit improved resistance to oxidation as with the metals copper and nickel.

The bulk conductivities of the dry metal powders were measured by a "tube" method, conducted by lightly compacting the metal powder in a cavity of set volume (1.6 cm diameter by 1 cm long) between two steel rods and reading the electrical resistance from rod to rod in ohms. (Since the dimensions of the cavity are known, the resistance can be converted to resistivity in ohm.cm by multiplying by a conversion factor of 2.011.)

EXAMPLE 17

In the initial silver trial, a silver powder containing 99 percent particles less than 325 mesh was heated to reflux for 30 minutes in an ethylene glycol solution containing 1 weight percent each of bis-(2-hydroxyethyl)tallowamine (Armostat 310 from Akzo), catechol (1,2-dihydroxybenzene) and 4-t-butylcatechol. The product agglomerated, forming large balls. Thereafter, the reaction mixture was sonicated during treatment with a Heat Systems W385 475 watt, 20 KHz ultrasound unit which was connected to a horn dipping into the reaction medium. Using this system for sonication with one second pulses at 70 to 90 percent power and a 50 percent duty cycle, agglomeration of the particles was largely prevented, so that 99 percent of the product remained below 325 mesh. The initial "tube" resistance of the product was 0.044 ohms, significantly lower than the equivalent resistance of the untreated material (13 ohms).

EXAMPLE 18

The procedures of Example 17 were repeated on a finer silver powder commercially available from Aldrich Chemical Co. (The silver powder used is sold as having particle sizes from 2 to 3.5 microns, but particle size analysis by granulometer indicated its median size to be 11 microns.) Several runs were conducted, treating this material in the solution of Example 17 at 130° C. using sonication for two hours on a 90 percent duty cycle. The treated particles were found to have agglomerated somewhat, having a median particle size by granulometer of 20 microns. The treated silver powder exhibited a "tube" resistance of 0.02 ohms, a tenfold reduction from the 0.2 ohms of the untreated material.

EXAMPLE 19 CONTROL

As a control, the silver powder of Example 18 was heated and sonicated for 1 hour at 130° C. in xylene. The silver recovered had a somewhat lower "tube" resistance than the untreated material, but was less stable towards oxidation than the same material treated with the solution of the invention in Example 18. (The control-treated material had a "tube" resistance of 20 ohms after 456 hours of aging at 71° C., compared with 0.8 ohms for the silver treated in Example 18 which was aged in the same manner.)

HYPOTHETICAL EXAMPLE 20

The procedures of Examples 17 and 18 are repeated, using palladium powders containing particles of comparable sizes. After treatment with the solutions of those examples, the palladium particles are found to have reduced amounts of oxides on the surfaces thereof, as evidenced by a visibly brighter appearance. The "tube" resistances of the samples of treated particles in bulk are found to be approximately an order of magnitude lower than those for untreated particles or particles treated with solvents lacking the active ingredients of the compositions of the invention. Furthermore, aging tests comparable to those of Example 19 indicate that the treated palladium powders are more oxidation resistant than particles treated with control solvents lacking these active ingredients.

I claim:

1. A process for treating the surfaces of objects coated with surface layers of nonconductive metal compounds to render said surfaces electrically conductive and oxidation resistant, said objects containing a metal selected from the group consisting of copper, nickel, cobalt, silver and palladium, said process comprising the steps of:
   (a) heating said surfaces of objects in the presence of a reagent composition consisting essentially of:
      (i) an organic amine compound having at least one group carrying a coordinative functional substituent selected from the group consisting of amino, hydroxy, carboxy and mercapto groups, with the amine nitrogen atom and the functional substituent being separated by from two to six other atoms, and
      (ii) at least one phenolic compound represented by the formula

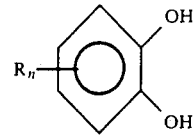

wherein n is an integer having a value from 0 to 4 and each R independently represents an organic radical selected from the group consisting of substituted and unsubstituted, straight and branched alkyl and alkenyl groups, acid groups, aldehyde groups, ester groups, ether groups, amino groups and amido groups, wherein said heating takes place at a temperature and a time duration sufficient to reduce substantially all oxides of metals which are present in the surface layer thereby rendering said surfaces of the objects electrically conductive and oxidation resistant; and
   (b) separating said objects from the reagent composition and the resulting reaction products formed after heating in step (a).
2. The process of claim 1, wherein said metal is selected from the group consisting of copper and nickel.
3. The process of claim 1, wherein said metal comprises silver.
4. The process of claim 1, wherein said metal comprises palladium.
5. The process of claim 1, wherein said organic radical is a substituted or alkenyl unsubstituted, straight or branched alkyl group, an acid group, an aldehyde group, or an ester group.
6. The process of claim 1, wherein said at least one phenolic compound (ii) is selected from the group consisting of 1,2-dihydroxybenzene, 3,5-di-t-butyl 1,2-dihydroxybenzene, 3,4-dihydroxybenzaldehyde and 3,4-dihydroxybenzoic acid.
7. The process of claim 1, wherein said organic amine compound (i) and said phenolic compound (ii) are combined in a single reagent compound.
8. The process of claim 7, wherein said single reagent compound is N-(N'-2-aminoethyl 2-aminoethyl) 1,2 dihydroxybenzamine or diethanolaminoethyl 3,4-dihydroxybenzoic ester.
9. The process of claim 1, wherein the objects and the reagent composition are contained in a liquid carrier.
10. The process of claim 9, wherein said liquid carrier comprises an alcohol or a polyol containing at least two adjacent hydroxyl groups.
11. The process of claim 1, wherein said heating takes place in the presence of ethylene glycol.
12. The process of claim 10 wherein said heating takes place in an ethylene glycol solution containing from 0.1 to 20 wt. % of the amine compound (i) and from 0.1 to 20 wt. % of the at least one phenolic compound (ii).
13. The process of claim 12, wherein said ethylene glycol solution comprises:
   (i) from 0.1 to 10 wt. % of said amine compound:

(ii) from 0.1 to 10 wt. % of 1,2-dihydroxybenzene; and (iii) from 0.1 to 10 wt. % of 3,5-di-t-butyl 1,2-dihydroxybenzene.

14. The process of claim 12 wherein said heating takes place at a temperature of from about 100° to about 300° C.

15. The process of claim 1 wherein said objects are copper or nickel particles having a diameter below 500 μm.

16. The process of claim 1 wherein said objects constitute a commercial, non-conductive metal powder of which the particles carry a metal oxide surface coating.

17. The process of claim 1, wherein the objects and the reagent composition are sonicated in a manner effective to improve and expedite reduction of the metal oxides on the surfaces of said objects.

* * * * *